(12) United States Patent
Honda

(10) Patent No.: US 6,958,941 B2
(45) Date of Patent: Oct. 25, 2005

(54) CIRCUIT BOARD AND INFORMATION STORING APPARATUS EQUIPPED THEREWITH

(75) Inventor: Takayuki Honda, Tokyo (JP)

(73) Assignee: TEAC Corporation, Tokyo (JP)

( * ) Notice: Subject to any disclaimer, the term of this patent is extended or adjusted under 35 U.S.C. 154(b) by 201 days.

(21) Appl. No.: 10/460,293

(22) Filed: Jun. 11, 2003

(65) Prior Publication Data

US 2003/0231533 A1 Dec. 18, 2003

(30) Foreign Application Priority Data

Jun. 17, 2002 (JP) ............................. 2002-175412

(51) Int. Cl.$^7$ ................................................ G11C 7/00
(52) U.S. Cl. ................................................ 365/189.01
(58) Field of Search .......................... 365/189.01, 212, 365/189.03

(56) References Cited

U.S. PATENT DOCUMENTS 5,185,736 A * 2/1993 Tyrrell et al. ............... 370/358
5,801,652 A * 9/1998 Gong ........................ 341/131

FOREIGN PATENT DOCUMENTS

JP          11-261392         9/1999

* cited by examiner

Primary Examiner—Thong Q. Le
(74) Attorney, Agent, or Firm—Katten Muchin Rosenman LLP

(57) ABSTRACT

In a circuit board including an analog circuit and a digital circuit, the S/N ratio reduction resulting from the interference of digital signals with analog signals is suppressed. The circuit board includes a digital signal processing section forming part of the digital circuit, digital signal external conductors connected to the digital signal processing section, and digital signal output control means for interrupting the transmission of the digital signals from the digital signal processing section to the digital signal external conductors. A decrease in the limitation for the wiring pattern and the device arrangement provides an increase in the degree of freedom for designing, thereby making it possible to miniaturize the circuit board and to reduce the manufacturing cost thereof.

9 Claims, 8 Drawing Sheets

US 6,958,941 B2

CIRCUIT BOARD AND INFORMATION STORING APPARATUS EQUIPPED THEREWITH

BACKGROUND OF THE INVENTION

1. Field of the Invention

The present invention relates to a circuit board on which an analog circuit and a digital circuit are mounted. The present invention also relates to an information storing apparatus, which is equipped with such a circuit board.

2. Description of the Related Art

In recent years, the miniaturization of electrical appliances causes printed circuit boards used therein to be further miniaturize. In fact, a circuit board, in which a plurality of circuits having different functions is disposed, is also developed. Such a circuit board includes both analog circuits dealing with analog signals as well as digital circuits dealing with digital signals are, and is widely used in a printed circuit board assembly (hereinafter referred to as "PCBA") or the like for driving an FDD.

The miniaturization of the circuit board including the analog circuit and the digital circuit is requested more and more strongly. In this case, it is occasionally necessary to dispose external conductors for analog signals and external conductors for digital signals in very close mutual position either on the surface of a circuit board or on the surfaces of different circuit boards.

Referring to FIG. 8, an example of a PCBA, in which an analog circuit and a digital circuit are disposed, will be described.

On one side of a circuit board 100, a USB FDD controller 101 including an LSI and an external memory 102 are mounted, and the USB FDD controller 101 and the external memory 102 are connected with each other via external conductors 103. Digital signals for controlling the external memory 102 are supplied from the USB FDD controller 101 and return signals are supplied to the USB FDD controller 101 via the external conductors 103. On the rear side of the circuit board 100, drive control section 110 for controlling to drive a head for the FDD (not shown) is disposed, and external conductors 111 connected to the drive control section 110 are disposed on the rear side of the circuit board 100 and extend to the side of the USB FDD controller 101, crossing the external conductors 103 on the front side of the circuit board 100.

Moreover, the external conductors 111 are connected to the external conductors 104 disposed on the surface of the circuit board 100 via through holes 112, whereas the external conductors 104 are connected to the USB FDD controller 101. Analog signals are output as drive control signals from the USB FDD controller 101 and are transmitted from the external conductors 104 to the drive control section 110 via the through holes 112 and the external conductors 111. In the circuit board 100, the digital signal conductors 103 and the analog signal conductors 111 are extending on the surfaces different from each other and cross each other.

In a circuit board 200 shown in FIG. 9, there is the same arrangement as in the circuit board 100 shown in FIG. 8, except for the external memory 102, as disposed on the circuit board 100. Similarly, the digital signal external conductors 103 and the analog signal external conductors 111 are disposed on the different surfaces.

In the stage of developing a circuit board, a firmware is mounted in the USB FDD controller 101 and/or an external memory is connected to the external conductors 103 on the circuit board 200 in the case of executing the debug, if necessary. After these works, the external memory is removed and the product is completed as a circuit board including no external memory. In case of need, the debug and/or inspection is again carried out in the state in which the external conductors 103 are connected to the external memory. In view of these facts, the external conductors 103 remain mounted on the circuit board. Even when the external memory is connected to the external conductors, digital signals are supplied from the USB FDD controller 101 to the external conductors 103.

Analog signals on the circuit board are continuously changing and the transmission of information is carried out with the aid of such change in the signals. Accordingly, the analog signals have to be transmitted with high fidelity to desired devices via the external conductors. When, however, digital signal conductors are placed on the circuit board, high frequency digital signals are transmitted thereon. Moreover, when the digital signal conductors are disposed such that they are spatially close to the analog signal conductors, the high frequency signal components resulting from the digital signal interfere with analog signals flowing in the analog signal conductors to generate noise in the analog signals. This causes to disturb a proper transmission of information. Especially in the above-mentioned circuit board for controlling the FDD, the digital signals occasionally interfere with the analog signal in an input having high impedance, such as the input from a head, thereby causing the signal to noise ratio to be deteriorated. Moreover, in the case of the circuit board including no external memory, the digital signals emanate from the digital signal conductors, so that the characteristic of reading the analog signals from the head is deteriorated.

To overcome these problems, the pattern of conductors is designed such that the analog signal conductors are not close to the digital signal conductors, or a multi-layer PCB (more than three layers), in which either different type signal conductors are disposed on corresponding different layers or the analog signal conductors detour the digital signal conductors, is employed. These procedures prevent the signal to noise ratio from deteriorating.

However, in a single layer PCB or double layer PCB, the restrictions on the circuit arrangement (the positions of the parts to be mounted, the pin arrangement of the devices to be mounted, the width of conductors and others) makes it difficult to separate the digital signal conductors from the analog signal conductors having high impedance, and therefore it is unavoidable to trade off the digital and analog properties. Furthermore, a multi-layer PCB provides an increase in the manufacturing cost of the circuit board, and therefore the restriction on the cost makes it difficult to employ such a multi-layer PCB.

SUMMARY OF THE INVENTION

In view of the above problems, it is an object of the present invention to provide a circuit board capable of preventing analog signals from interfering with the digital signals to ensure a reliable transmission of the analog signals with a reduced amount of noise, even when the analog signal conductors are disposed spatially close to the digital signal conductors.

It is another object of the present invention to provide an information storing apparatus in which such circuit boards are mounted.

The above mentioned objects are attained by the following circuit board according to the invention as well as by the following information storing apparatus according to the invention:

In accordance with a first aspect of the invention, a circuit board comprises an analog circuit section and a digital circuit section, wherein the digital circuit section includes at least one digital signal processing section for outputting at least one digital signal and at least one digital signal external conductor connected to the at least one signal processing section, and wherein at least one digital signal output control means for controlling whether or not the at least one digital signal output from the at least one digital signal processing section to the at least one digital signal external conductor is interposed between the at least one digital signal processing section and the at least one digital signal external conductor.

In accordance with a second aspect of the invention, the at least one digital signal output control means in the circuit board prohibits the function of outputting the at least one digital signal in the at least one digital signal processing section to the at least one digital signal external conductor.

In accordance with a third aspect of the invention, the at least one digital signal output control means in the circuit board is constituted by a connection means for on/off-controlling an electrical connection between the at least one digital signal processing section and the at least one digital signal external conductor.

In accordance with a fourth aspect of the invention, the at least one digital signal output control means in the circuit board has a function of converting the at least one digital signal supplied from the at least one digital signal processing section into a DC signal having a predetermined constant potential.

In accordance with a fifth aspect of the invention, the at least one digital signal processing section in the circuit board is mounted onto a semiconductor chip together with at least one analog signal processing section for processing and outputting an analog signal processed in the analog circuit section.

In accordance with a sixth aspect of the invention, a circuit board comprises, (a) at least one digital signal processing section for processing at least one digital signal;

(b) at least one switch means connected to the at least one digital signal processing section for on/off-controlling the output of the at least one digital signal output therefrom;

(c) at least one digital signal external conductor connected to the at least one switch means;

(d) an analog signal processing section connected to the at least one digital processing section for processing at least one analog signal; and (e) at least one analog signal external conductor connected to the analog signal processing section for inputting/outputting the at least one analog signal.

In accordance with a seventh aspect of the invention, the at least one digital signal processing section, the at least one switch means and the at least one digital signal external conductor in the circuit board are unified in the form of an integrated circuit.

In accordance with an eighth aspect of the invention, an information storing apparatus comprises, (a) an information recording medium driving means for driving an information recording medium;

(b) a pick-up means disposed in said information recording medium driving means for reproducing an information signal by scanning the information recording medium;

(c) an analog circuit section connected to the pick-up means;

(d) a digital circuit section connected to the analog circuit section, (e) wherein the analog circuit and the digital circuit are disposed on a circuit board, wherein the digital circuit section comprises, (f) at least one digital signal processing section for processing at least one digital signal to output the at least one digital signal thus processed; and (g) at least one digital signal output control means connected to the at least one digital signal processing section for converting the at least one digital signal output from the at least one digital signal processing section into a DC signal having a predetermined constant potential, (h) at least one digital signal external conductor connected to the at least one digital signal output control means.

In accordance with a ninth aspect of the invention, an information storing apparatus comprises, (a) an information recording medium driving means for driving an information recording medium;

(b) a pick-up means disposed in the information recording medium driving means for reproducing an information signal by scanning the information recording medium;

(c) an analog circuit section connected to the pick-up means;

(d) a digital circuit section connected to the analog circuit section;

(e) wherein the analog circuit section and the digital circuit section are mounted on a circuit board, wherein the digital circuit section comprises, (f) at least one digital signal processing section for processing and outputting at least one digital signal;

(g) at least one switch means connected to the at least one digital signal processing section for on/off-controlling the output of the at least one digital signal generated in the at least one digital signal processing section; and (h) at least one digital signal external conductor connected to the at least one switch means for transmitting the at least one digital signal.

In accordance with the invention, the digital signal output control means is capable of interrupting the transmission of the digital signal output from the digital signal processing section to the digital signal external conductors in accordance with the requirement, so that the interference of the digital signals with the analog signals can be suppressed and therefore analog signals having a reduced effect of the noise resulting from the digital signals may be transferred to the outside via external conductors. As a result, no wiring pattern for avoiding the approach of the digital signal external conductors to the analog signal wiring is required, thereby increasing the degree of freedom in designing. The suppression of the mutual interaction between the signals eliminates the hindrance in the miniaturization of the circuit board, thereby enabling the circuit board to be further miniaturized. The usage of a single or double layer circuit board makes it possible to reduce the production cost.

When, for instance, the circuit board according to the invention is used as a control circuit board in an information storing apparatus, such as FDD, MO, CD, DVD or the like, the noise reduction in the analog system enhances the reading accuracy in the information storing apparatus. In particular, the edges of a signal are altered in accordance with the temperature in the digital system (the edge becomes sharp at lower temperature and accordingly the noise increases at lower temperature), thereby enabling the S/N resulting from the temperature variation to be reduced. In addition, the emanation of the undesired radiation can also be reduced.

In the circuit board according to the invention, when requiring to output the digital signal to the external conductors, the above operation with the digital signal output control means is interrupted (interrupting the transmission of the digital signals) and the digital signals can be supplied from the digital signal processing section to the digital signal external conductors.

The present invention deals with a circuit board on which analog circuits and digital circuits are disposed, which circuit board includes external conductors as parts of these circuits, and further at least one digital signal processing section for processing and outputting digital signals.

The present invention is preferably applicable to a circuit board for controlling the FDD, which includes analog circuits having high impedance. The present invention is applicable not only to a circuit board in which the analog and digital signals are processed, but also to a circuit board used in various electrical appliances.

Moreover, although a single layer circuit board or a double layer circuit board having a restricted wiring pattern is preferably used in the present invention, a multi-layer circuit board including more than three layers is also applicable.

The circuit board according to the invention includes at least one digital signal processing section and external conductors connected to the digital signal processing section. The digital signal processing section is normally formed by a packaged semiconductor chip (an integrated circuit). Analog signal processing sections for processing analog signals can also be included in the semiconductor chip. In a semiconductor chip including the analog signal processing section and the digital signal processing section, the analog circuits and the digital circuits are individually unified in the form of block, thereby enabling the interference between the analog and digital signals to be suppressed. Moreover, in the circuit board including the analog and digital signal processing sections, analog signal external conductors and digital signal external conductors are connected to a semiconductor chip. A semiconductor chip including the digital signal processing section and the analog signal processing section is normally used in the circuit board according to the present invention. However, the digital signal processing section and the analog signal processing section can, of course, be disposed respectively in different semiconductor chips.

The digital signal output control means according to the invention should be capable of controlling the system, either such that no digital signals are supplied from the digital signal processing section to the digital signal external conductors, or such that the output signals is converted into a DC signal having a predetermined constant potential, so that there is no special limitation on the structure thereof. As one example, the digital signal output control means can be constituted such that the function of outputting the digital signals is interrupted in the digital signal processing section. This function can be achieved, for instance, by prohibiting or limiting the function of the digital signal generating section in the digital signal processing section.

All external conductors or part thereof can be used as digital signal external conductors in which the output of the digital signals is controlled by the digital signal output control means. The present invention intends to exclude the effect of the digital signals on the analog signal. Accordingly, the object of the present invention is attained, so long as the output of the digital signals to the digital signal external conductors, such output providing the above effect, is exclusively controlled. The control of outputting the signal to the digital signal external conductors by the digital signal output control means can be carried out either just in front of the digital signal external conductors or in the midway of the digital signal external conductors.

In another embodiment of the digital signal output control means according to the invention, connection means is provided for on/off-controlling the connection of the digital signal processing section and the digital signal external conductors. The connection means for on/off-controlling the connection can be realized by a mechanical switch, a state buffer, a switching element or the like. The control of the state buffer, the switching element or the like can be performed either mechanically or in software. As a switching element, a transfer gate, a pass transistor or the like can be employed.

In another embodiment of the digital signal output control means according to the invention, signal level changing means is provided for converting the digital signal supplied from the digital signal processing section to the digital signal external conductors into a DC signal having a predetermined constant potential. With the aid of the signal level changing means, the digital signal can be supplied in the state of a reduced interference with the analog signals, even when the digital signal has to be output. The signal level changing can be carried out by reducing the outputting intensity in a digital signal outputting section, when the digital signal outputting section is included in the digital signal processing section. In another embodiment, the digital signal output to the external conductors can also be converted into a DC signal by regulating the amount of transmitting the digital signals in the digital signal processing section.

Other objects, features and advantages of the present invention will become apparent from the following description of the preferred embodiments with reference to the accompanying drawings.

DESCRIPTION OF THE PREFERRED EMBODIMENTS

Referring now to the accompanying drawings, the present invention will be described in detail.

(Embodiment 1)

Figure 1:
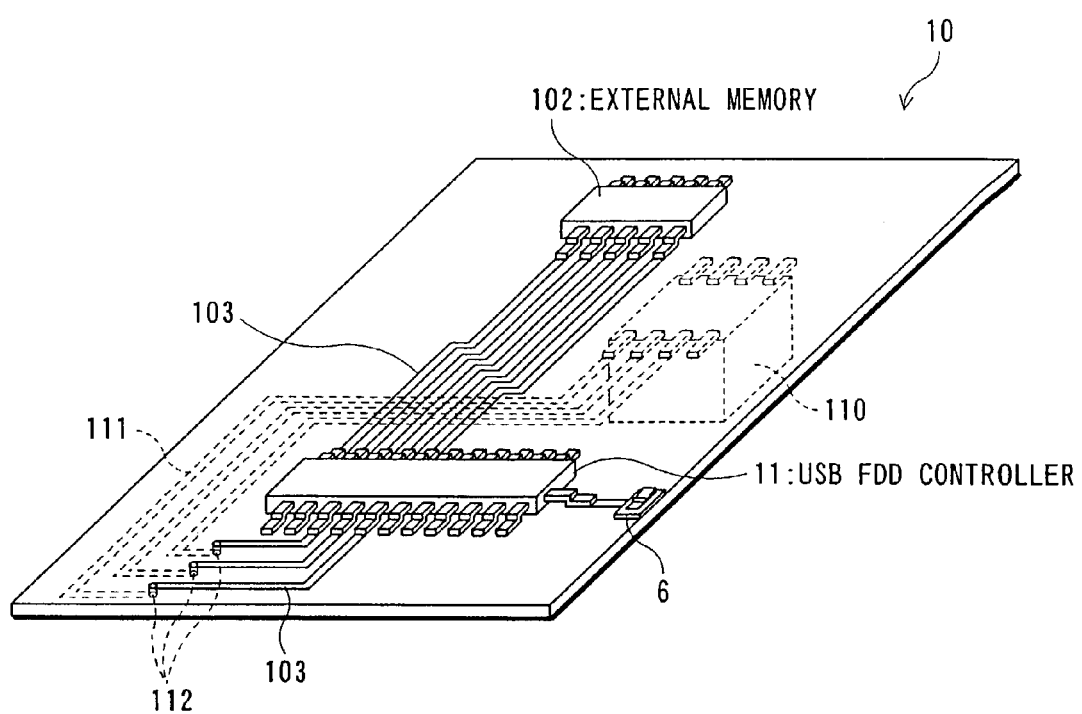
FIG. 1 is a perspective view of a circuit board in an embodiment of the invention.
Figure 2:
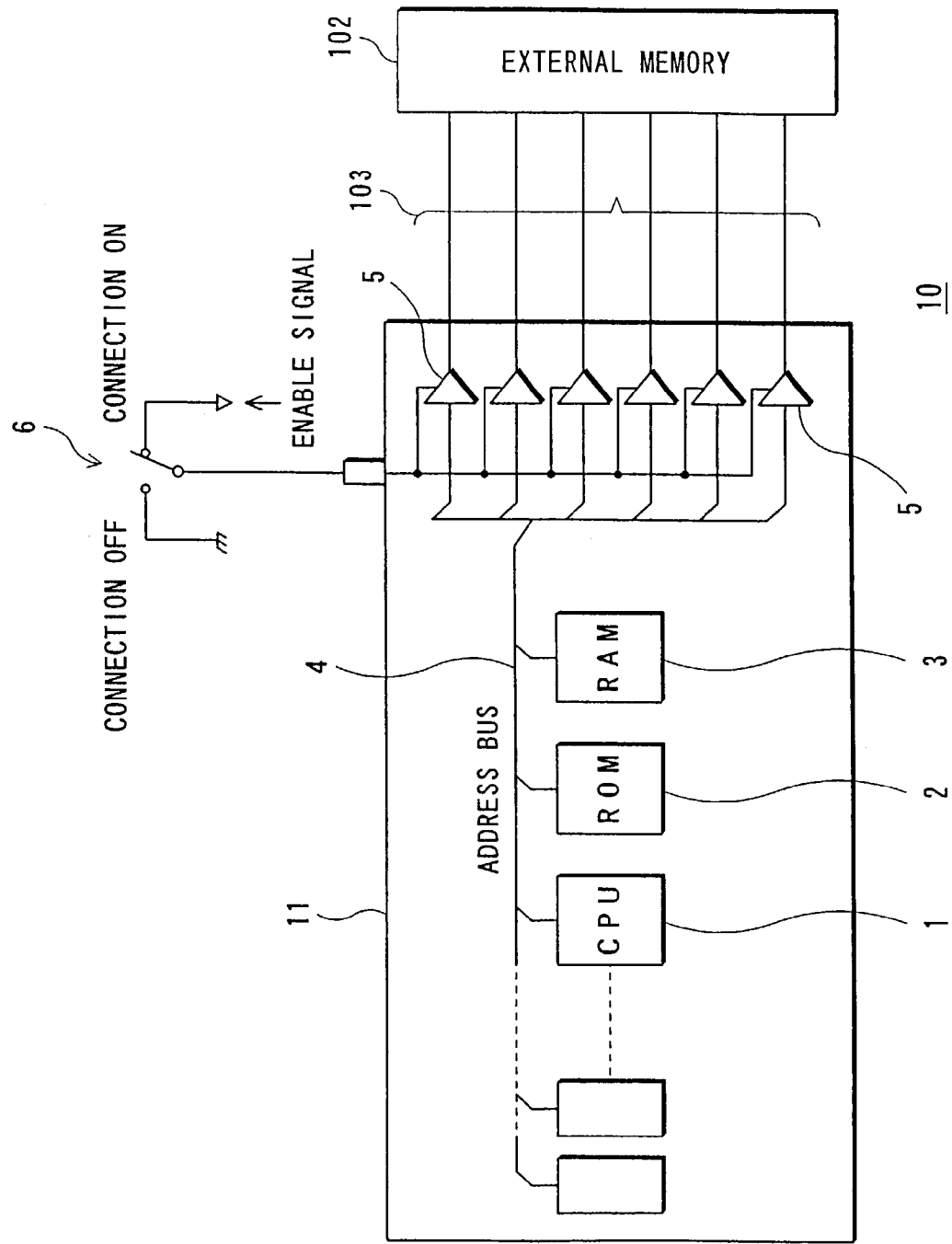
FIG. 2 is a block diagram showing a circuit disposed on part of the circuit board.
Figure 8:
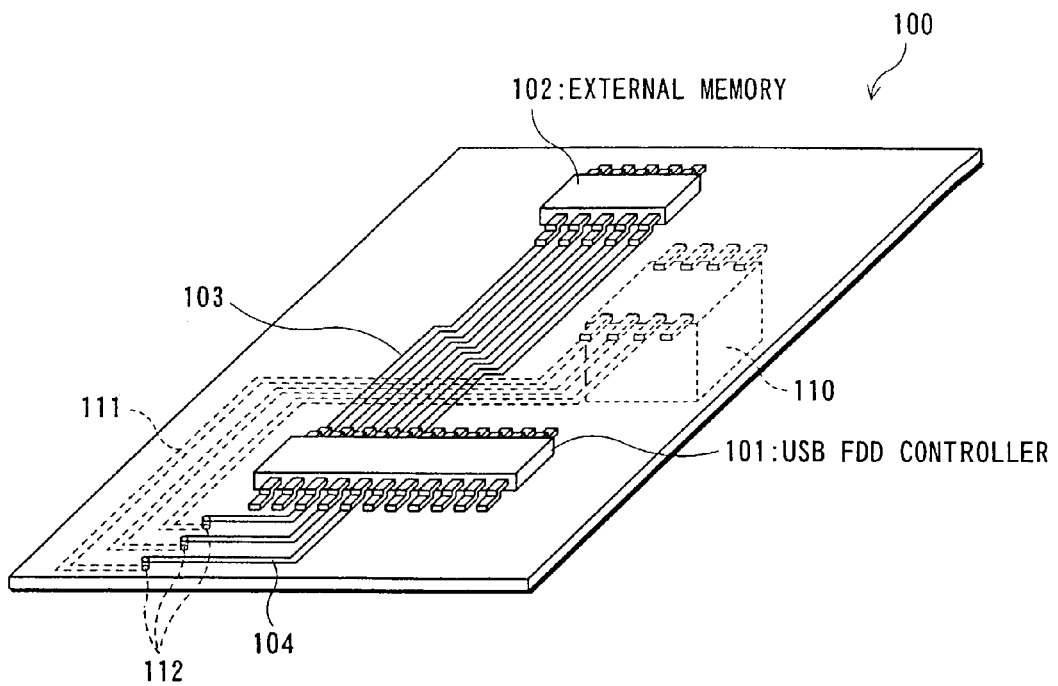
FIG. 8 is the perspective view of the conventional PCBA circuit board onto which an external memory is mounted.
Figure 9:
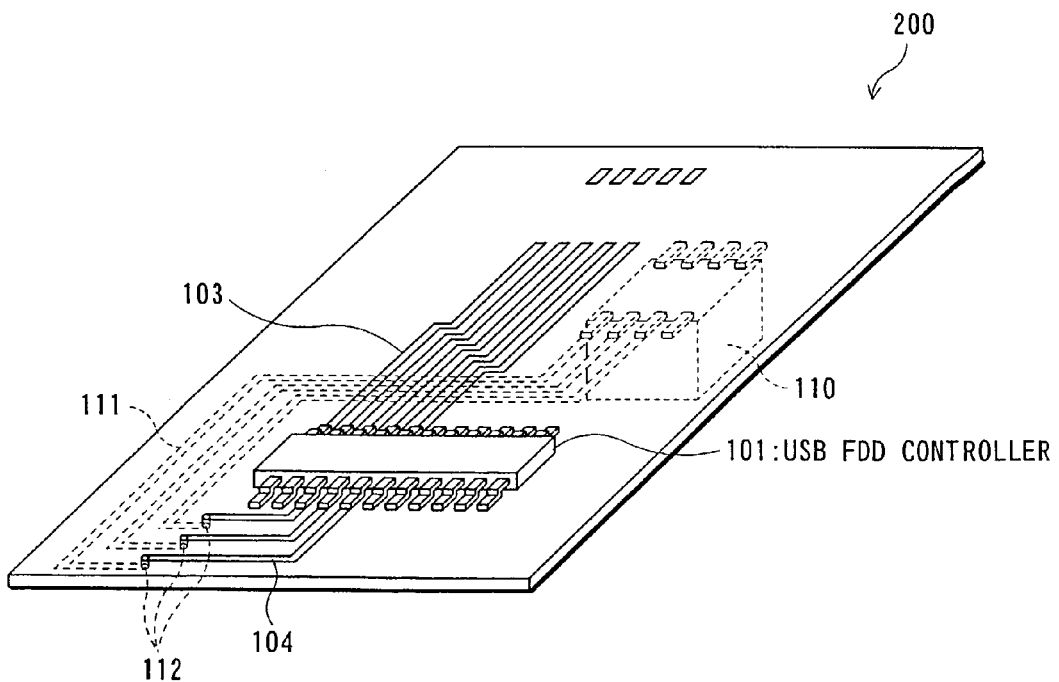
FIG. 9 is the perspective view of the conventional PCBA circuit board onto which no external memory is mounted.

As shown in FIGS. 1 and 2, a circuit board 100 according to a first embodiment of the invention has a device arrangement similar to that in the circuit board 100 shown in FIG. 8. An USB FDD controller 11, an external memory 102, digital signal external conductors 103 and analog signal external conductors 104 are disposed on one side of the circuit board 100, and a drive control section 110 and analog signal external conductors 111 are disposed on the other side of the circuit board 100, in which case, the analog signal external conductors 104 and analog signal external conductors 111 are connected to each other via through holes 112. As for the same elements as those in the conventional circuit board, the same reference numerals are used and the detailed description of these elements are omitted.

FIG. 2 is a block diagram showing part of the circuit arrangement in the circuit board 100. The USB FDD controller 11 is constituted by a semiconductor chip, in which a read/write circuit, a driver for a stepping motor, a control circuit and others are built in order to process both digital signals and analog signals. The entire operation of a FDD device is controlled by the USB FDD 11, in which information is received and/or supplied from/to a floppy disk in response to a command signal transmitted from a host apparatus (not shown) (including the exchange of data with the external memory) and/or a stepping motor is used to control the tracking of a magnetic head on the floppy disk in the radial direction. In order to attain such operations, the USB FDD controller 11 has analog circuits and digital circuits for performing a plurality of functions, in which case, the digital signal processing section and the analog signal processing section are connected to each other. In the present invention, there is a possibility that the digital signal processing section and the analog signal processing section are not connected to each other.

In FIG. 2, the USB FDD controller 11 includes CPU 1, ROM 2 and RAM 3 forming part of the digital signal circuit, and connected to each other via an address bus 4. In this case, part of the ROM 2 is constituted by a flash ROM, and the operation of the USB FDD controller 11 is executed by the CPU 1, which is controlled by a firmware written in the flash ROM.

The CPU 1, ROM 2, RAM 3 and the firmware serve as part of both the digital signal processing section and the analog signal processing section.

The address bus 4 is connected to the input terminal of triple state buffers 5—5. A dip switch 6 mounted on the circuit board 10 is connected to the gate control terminal of the triple state buffers 5—5, and one contact of the dip switch 6 is grounded and the other contact is connected to the USB FDD controller 11 such that an enable signal (ENABLE signal in FIG. 2) may be supplied therefrom. The output terminals of the triple state buffers 5—5 are connected to the digital signal external conductors 103. Switch means capable of controlling the on/off switching, that is, digital signal output control means in the present invention is constituted by the triple state buffers 5 and the dip switch 6.

In the following, the function of the circuit board 10 will be described.

When regarding a high fidelity transmission of analog signals as important, and when interrupting the transmission of the digital signal to the digital signal external conductors 103, the dip switch 6 is set in the grounded state such that an enable signal is not transmitted to the gate control terminals of the triple state buffers 5, so that the triple state buffers 5 turn to a disenable state. In this case, the digital signals from the address bus 4 are not output from the triple state buffer 5, and therefore the digital signal processing section is disconnected from the digital signal external conductors 103, so that the digital signals cannot be transferred to the digital signal external conductors 103. As a result, the digital signals interfere with the analog signals flowing into the analog signal external conductors 111 via the external conductors 103 for the digital signals, thereby enabling the generation of noise to be suppressed. When, however, the output of the digital signals to the digital signal external conductors 103 is required, that is, for instance, when using the external memory 102 to exchange data between the digital signal processing section and the external memory, the dip switch 6 is set on the ENABLE side. Hence, the enable signal is input into the gate control terminals of the triple state buffers 5 and the triple state buffers 5 become in an enable state. As a result, the digital signal processing section is electrically connected to the external conductors 103 for the digital signals, thereby making possible to exchange the digital data with the address bus 4 and the digital signal external conductors 103 via the triple state buffers 5.

In the description of the first embodiment, the function of the circuit board having the external memory 102 is explained exclusively in the case when the digital signal processing section is connected/disconnected to the digital signal external conductors 103. However, the following procedure is conceivable: The external memory 102 is mounted on the circuit board, when performing, for instance, the debug, and then the digital signals are output to the digital signal external conductors 103 by operating the dip switch. Thereafter, the external memory 102 is removed from the circuit board 10 and the digital signals cannot be output to the digital signal external conductors 103 using the dip switch 6. In such a circuit board, it is possible to output the digital signals to the digital signal external conductors by operating the dip switch 6, when the digital signals should be output, for example, for the sake of inspection.

(Embodiment 2)

Figure 3:
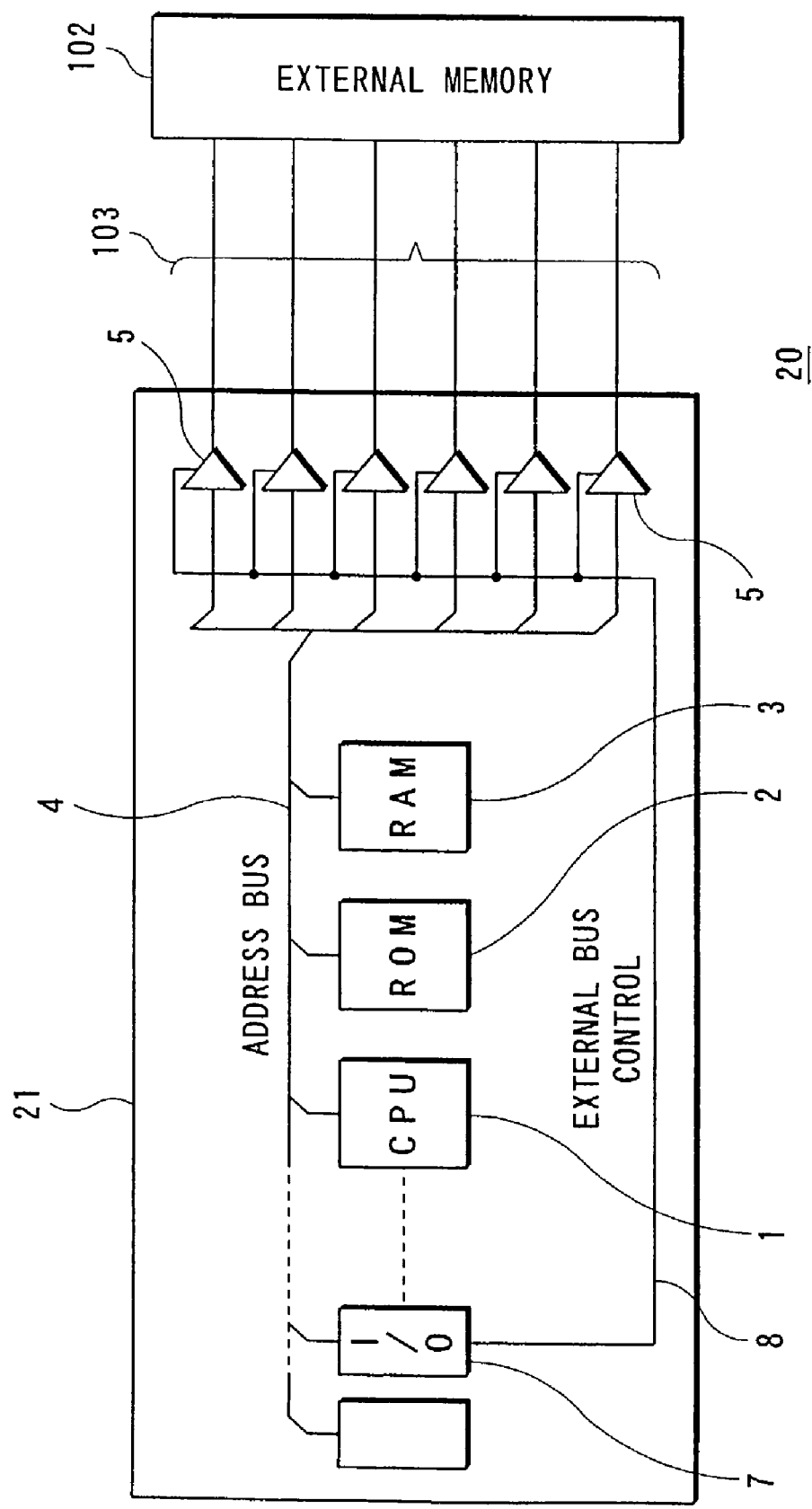
FIG. 3 is a block diagram showing a circuit disposed on part of a circuit board in another embodiment of the invention.

FIG. 3 shows a second embodiment in which the electrical connection between the digital signal processing section and the digital signal external conductors can be controlled in a software. In this case, a circuit board 20 is equipped with an USB FDD controller 21 and has a structural arrangement similar to that in the first embodiment. That is, an external memory 102 and digital signal external conductors 103 are included therein along with analog signal external conductors, a drive control section, analog signal external conductors and through holes.

Similarly to the first embodiment, the USB FDD controller 21 in the circuit board 20 includes a digital signal processing section consisting of CPU 1, ROM 2, RAM 3 and others, an analog signal processing section and a triple state buffers 5—5. Moreover, an I/O section 7 is disposed as part of the digital signal processing section. The I/O section 7 is connected to an address bus 4 for the digital signal processing section as well as to an end of the output signal line 8.

The other end of the output signal line 8 is connected to the gate control terminal of the triple state buffers 5. Similarly to the first embodiment, the address bus 4 is connected to the input terminals of the triple state buffers 5, and the digital signal external conductors are connected to the output terminals of the triple state buffers 5 and further connected to the external memory 102.

In the second embodiment, the I/O section 7 may be controlled by a firmware stored in the CPU 1 and ROM 2 in such a manner that an enable signal and disenable signal can be selectively output to the output signal line 8. In the second embodiment, therefore, digital signal output control means is constituted by the CPU 1, the firmware, the I/O section 7 and the triple state buffers 5—5.

The process procedure of the above-mentioned firmware causes the CPU 1 to be activated, and the function of the triple state buffers 5—5 is controlled by switching the signals supplied from the I/O section 7 to the output signal line 8, so that the connection between the digital signal processing section and the digital signal processing section is intermittently controlled. More specifically, when an enable signal is supplied from the output signal line 8, the triple state buffers 5 turn into an enable state, so that the address bus 4 is connected to the digital signal external conductors 103. On the other hand, when a disenable signal is supplied from the output signal line 8, the triple state buffers 5 become into a disenable state, and therefore the address bus 4 is disconnected from the digital signal external conductors 103.

In the above-mentioned control, before the action of the USB FDD controller 30 is transferred to the analog control in accordance with, for instance, an instruction in a firmware, a disenable signal is supplied to the output signal 8 so that the supply of the digital signals to the digital signal external conductors 103 is prohibited. Accordingly, in the transfer to the analog control, the generation of noise in the analog signals can be suppressed by the digital signals. On the other hand, either when the analog control is ended or when the digital control is required, an enable signal can be supplied to the output signal line 8, thereby enabling the digital signals to be output to the digital signal external conductors 103.

In other words, an easy control can be attained by dividing the program codes in the controller into those in the analog system and those in the other system, i.e., the digital system. The tradeoff between the analog characteristics and the external bus control may be avoided.

(Embodiment 3)

Figure 4:
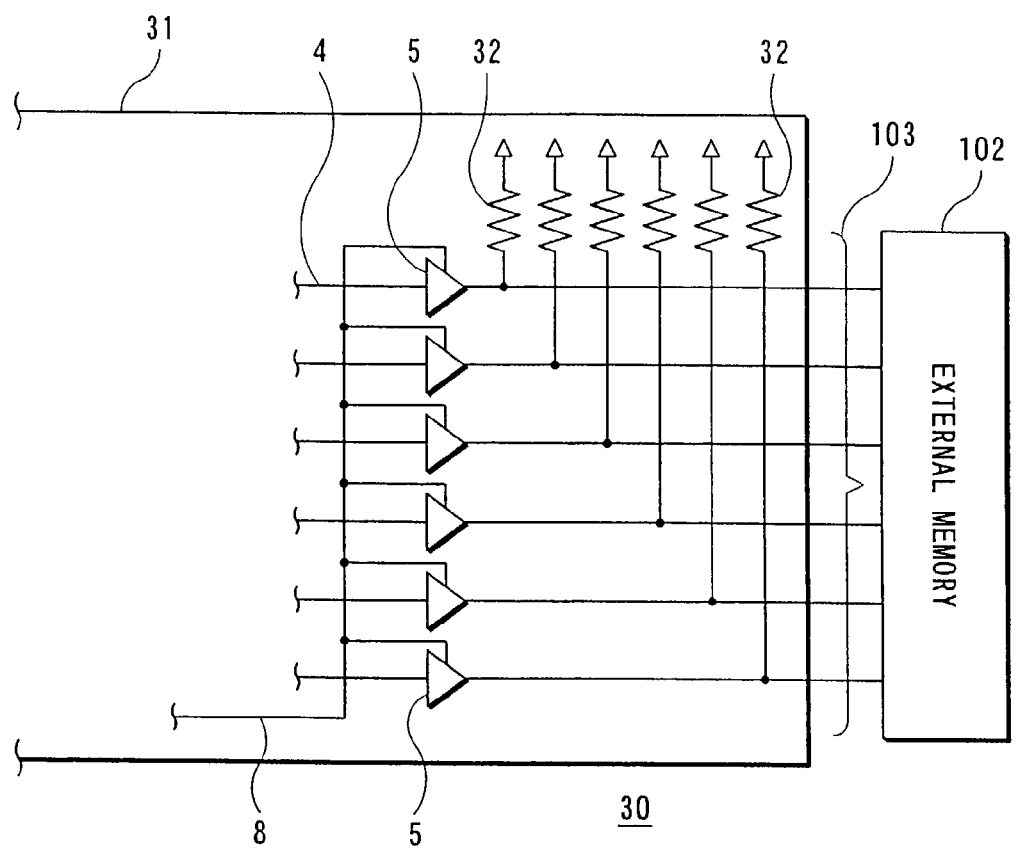
FIG. 4 is a block diagram showing a circuit disposed on part of a circuit board in another embodiment of the invention.

FIG. 4 shows part of a circuit board 30 according to the third embodiment in the form of a block diagram. The circuit board 30 has an USB FDD controller 31. The USB FDD controller 31 is a kind of variation from the USB FDD controller 21 in the second embodiment, wherein pull-up resistors 32 are connected to the output terminals of the triple state buffers 5 and the other elements in the circuit arrangement are the same as those in the first embodiment shown in FIG. 2. That is, the circuit board 30 is equipped with an external memory 102 and digital signal external conductors 103 as well as with analog signal external conductors, a drive control section, through holes, all of which are not shown in FIG. 4.

In the third embodiment, when the triple state buffers 5 turn in a disenable state in accordance with a control procedure similar to that in the second embodiment, the outputs of the triple state buffers 5 are set at H level by the pull-up resistors 32, thereby enabling the same effect as that in the first and second embodiments to be obtained.

(Embodiment 4)

Figure 5:
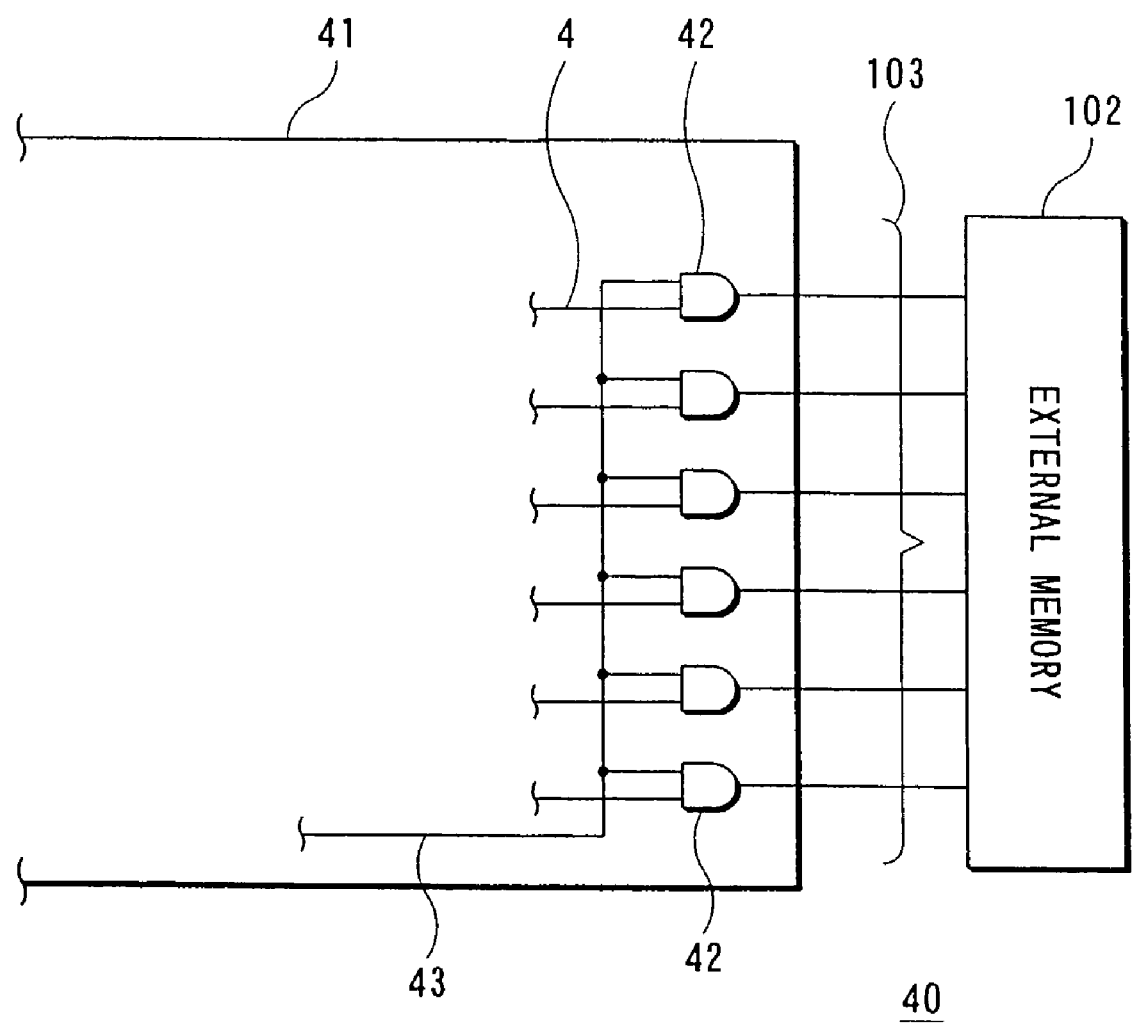
FIG. 5 is a block diagram showing a circuit disposed on part of a circuit board in another embodiment of the invention.

In each of the above embodiments, the electrical connection between the digital signal processing section and the digital signal external conductors is controlled by the triple state buffers. Such an electrical connection can, of course, be realized with another circuit arrangement. In the fourth embodiment of a circuit board 40 shown in FIG. 5, an USB FDD controller 41 is employed. The USB FDD controller 41 includes a digital signal processing section consisting of a CPU, ROM, RAM and others, all of which are not shown, an analog signal processing section and an address bus 4, as similarly to the case in the second embodiment. In the fourth embodiment, moreover, analog signal external conductors, a drive control section and through holes are also provided, as similarly to the case in each of the above embodiments.

The USB FDD controller 41 is equipped with AND gates 42—42. Address buffers 4 are connected to input terminals of the AND gates 42, and a control signal output line 43 is connected to the other input terminals of the AND gate 42. The control signal on the control signal output line 43 is controlled by both a CPU (not shown) and a firmware for controlling the CPU. Digital signal external conductors 103 are connected to the output terminals of the AND gates 42.

In the fourth embodiment, the connection between the digital signal processing section and the digital signal external conductors 103 are controlled by a control signal from the control signal output line 43 in accordance with the conductive/non-conductive state of the AND gates 42. Digital signal output control means according to the invention is constituted by the CPU (not shown), a firmware for controlling the CPU and the AND gates 42.

(Embodiment 5)

In each of the above embodiments, the digital signal output control means is installed in the USB FDD controller and the output of digital signals are controlled just in front of the digital signal external conductors. In the fifth embodiment, however, digital signal output control means is disposed in the outside of an USB FDD controller so as to control the output of digital signals to digital signal external conductors in the upstream of the digital signal output control means.

Figure 6:
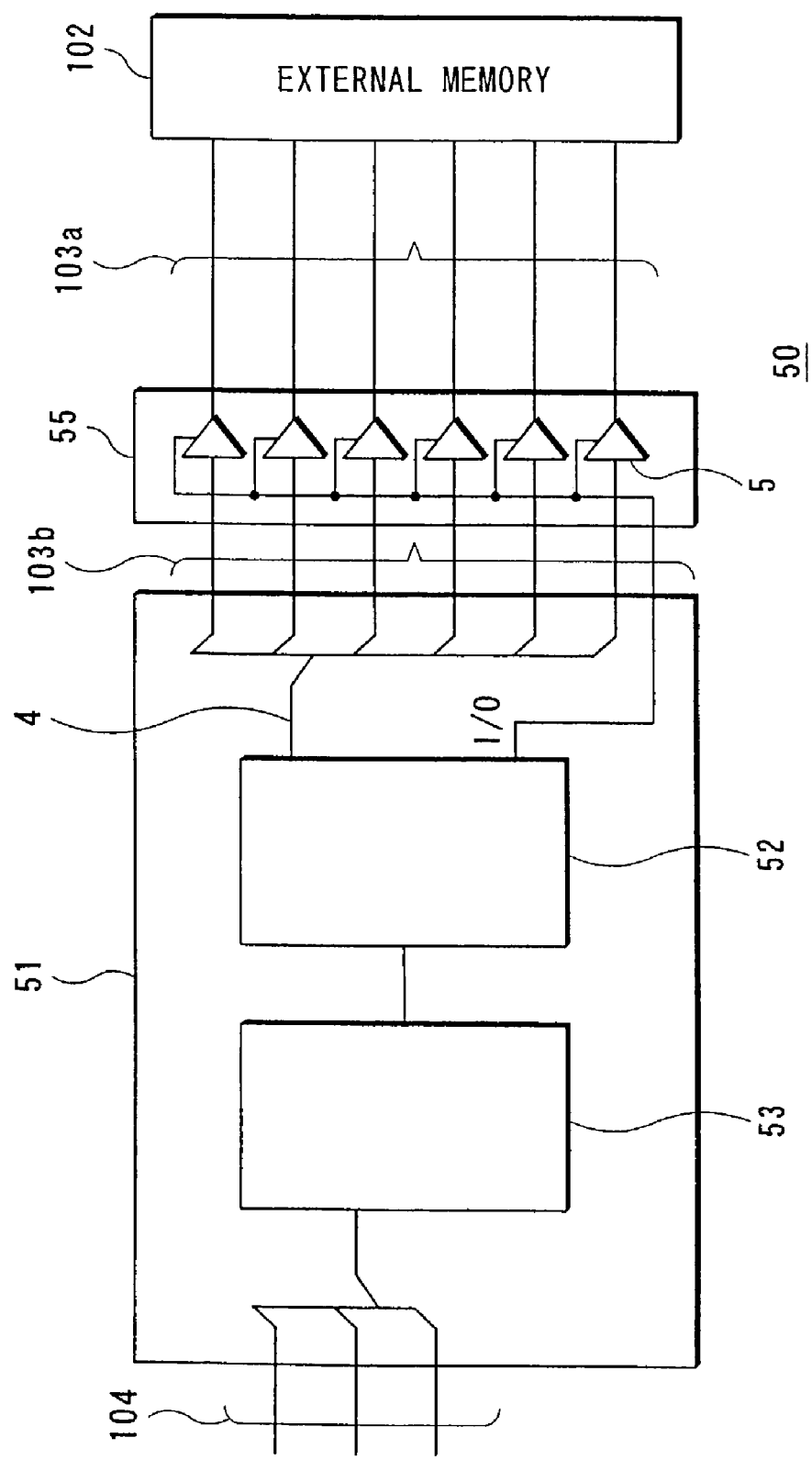
FIG. 6 is a block diagram showing a circuit disposed on part of a circuit board in another embodiment of the invention.

As shown in FIG. 6, a circuit board 50 in the fifth embodiment is equipped with an USB FDD controller 51. Similarly to the case in each of the above embodiments, the USB FDD controller 51 comprises a digital circuit section (digital signal processing section) 52 consisting of a CPU, ROM, RAM and others (all not shown), an analog circuit section (analog signal processing section) 53 and an address bus 4. Analog signal external conductors 104 are connected to the analog signal processing section 53. In the fifth embodiment, the circuit board also includes a drive control section (not shown) and through holes (not shown), similarly to the case in each of the above embodiments.

The address bus 4 is connected to terminals of second digital signal external conductors 103b, which are disposed in the outside of the USB FDD controller 51, and terminals of an output control interface 55 are connected to the other terminals of the second digital signal external conductors 103b. The interface 55 includes triple state buffers 5 disposed in accordance with the individual addresses, as shown in the second embodiment, and therefore performs an action similar to that in the second embodiment. Moreover, terminals of first digital signal external conductors 103a are connected to the other terminals of the output control interface 55, and input terminals of an external memory 102 are connected to the other terminals of the first digital signal external conductors 103a, as similarly to the case in the second embodiment.

In the fifth embodiment, the output of digital signals may also be on/off-controlled, as similarly to the case in the second embodiment, except for a difference in the position of output control. Hence, even if the analog signal external conductors 104 are disposed in the vicinity of the first digital signal external conductors 103a in the circuit board, the effect of noise can be suppressed by isolating the address signal from the output control interface 55.

In each of the above embodiments, it is assumed that the digital signal external conductors are connected to the external memory. In the present invention, the device connected to the digital signal external conductors is not restricted to the external memory. The other device for digital signals, an interface or the like can also be connected to the digital signal external conductors.

(Embodiment 6)

Figure 7:
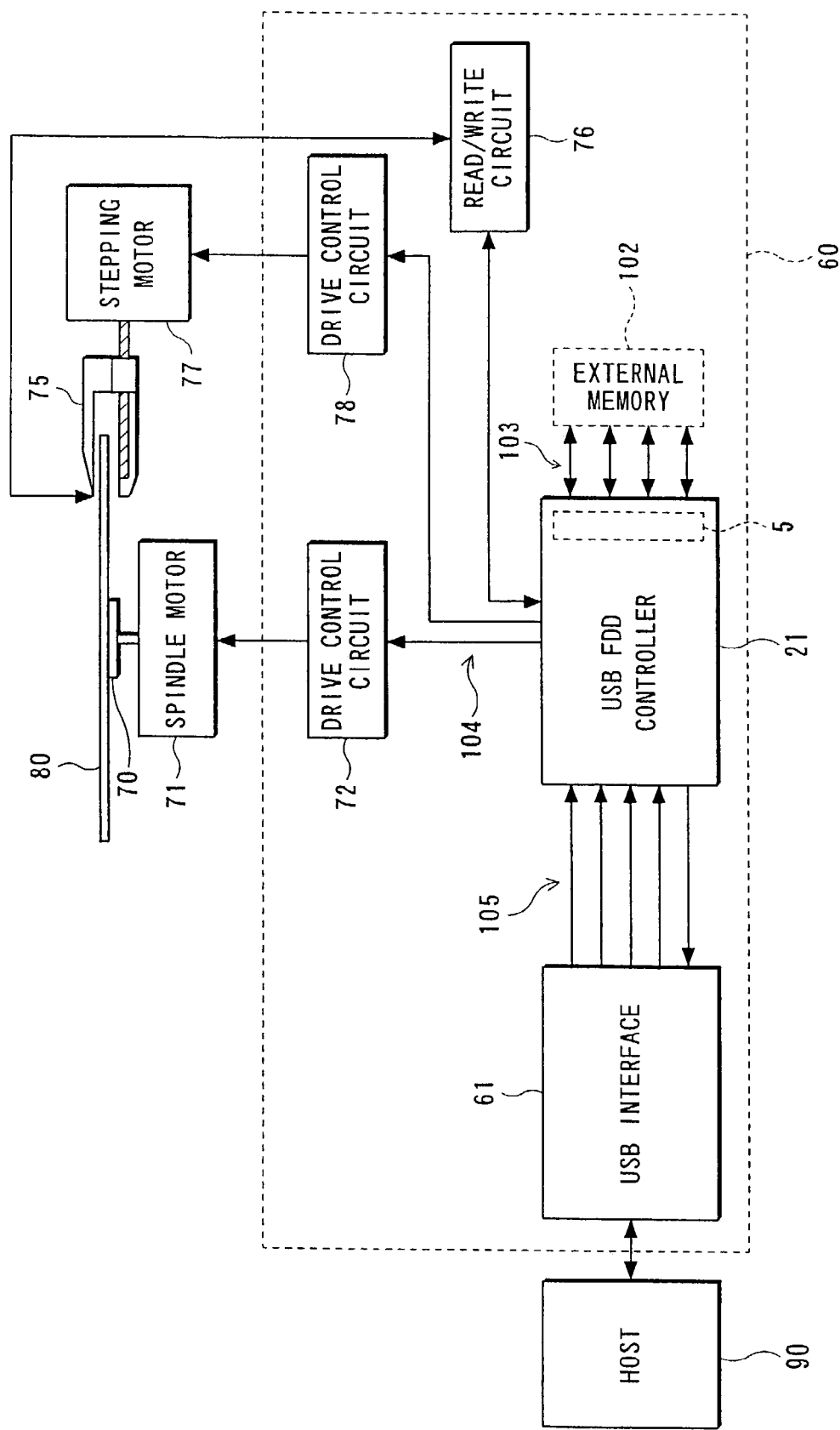
FIG. 7 is a block diagram showing an embodiment of an information storing apparatus including the circuit board according to the invention.

Referring now to FIG. 7, an embodiment of an information storing apparatus in which a circuit board according to the invention is mounted will be described.

In this embodiment, an FDD is used as an information storing apparatus, which is equipped with a circuit board 60 including the above-described USB FDD controller 21. Since the circuit arrangement of the USB FDD controller 21 has already been explained in the forgoing description, the detailed description of the arrangement is omitted.

The FDD includes a spindle motor 71 connected to the circuit board 60 for driving to rotate the circuit board 60, and a turntable 70 is fixed to the rotary shaft of the spindle motor 71. Consequently, the turntable 70 is designed such that it is rotated by a spindle motor 71, and further a drive control circuit 72 for driving the spindle motor 71 is connected thereto.

Moreover, pick-up means 75 (a magnetic head in this embodiment) is disposed to write/read data to/from a recording surface of an FD 80 mounted on the turntable 70. A read/write circuit 76 consisting of a write circuit for writing the data thereto and a read circuit for reading the data therefrom is connected to the pick-up means 75.

In addition, the pick-up means 75 includes a stepping motor 77 for moving the FD 80 mounted on the turntable 70 in the radial direction, and a drive control circuit 78 for driving the stepping motor 77 is connected thereto.

Moreover, the circuit board 60 includes an USB interface 61 which is capable of being connected to an external host (superior machine) 90 comprising a CPU and others via an USB cable, and the USB interface 61 is connected to the USB FDD controller 21 via the digital signal external conductors 105. Furthermore, the other digital signal external conductors 104 are connected to the USB FDD controller 21, which is connectable to an external memory 102. In the sixth embodiment, switching means of the triple state buffers 5 in the USB FDD controller 21 is designed such that it on/off-controls the digital signal external conductors 104. In accordance with the wiring patterns of the external conductors, moreover, a subject to be on/off-controlled can be selected either as the digital signal external conductors 105 or digital signal external conductors 104 and 105.

The USB FDD controller 21 is connected to the drive control circuits 72, 78 and the read/write circuit 76 via the analog signal external conductors. In this wiring pattern, the analog signal external conductors 104 are disposed partially close to the digital signal external conductors 103.

In the following, the function of the FDD will be described.

When an FD 80 is mounted onto the turntable 70, the FD 80 is rotated by the spindle motor 71 in the state of either writing or reading data. The rotation of the FD 80 is controlled by the drive control circuit 72.

The pick-up means 75 is moved in the radial direction by the stepping motor 77 so as to locate a predetermined address in the operation of seeking or writing/reading. The radial movement of the pick-up means 75 is controlled by the signal supplied from the drive control circuit 78. The signals for the drive control circuits 72 and 78 are generated in an analog circuit (not shown) of the USB FDD controller 21 and then supplied to the drive control circuits 72 and 78 via analog signal external conductors 104.

The USB FDD controller 21 carries out the digital signal process and the analog signal process, based on a motor start signal, motor control signals, data for writing and others, which are all supplied from the host 90 via the USB interface 61. In conjunction with this, the read data is transferred to the host 90 via the USB interface 61.

In the operation of the FDD, digital signals emanates from the digital signal external conductors 103, which is disposed to transmit/receive data to the memory 102 in the circuit board 60, even when the memory 103 is mounted thereon. In view of these facts, there is a possibility that the digital signals interfere with the analog signals, which flow in the analog signal external conductors 104. Accordingly, the triple state buffers 5 are disposed and controlled such that no digital signals are output in the digital signal external conductors 103, when analog signals are transmitted on the analog signal external conductors 104, as described in the first to fifth embodiments. This procedure ensures high reliability in the transmission of the motor control signals and read/write signals, thereby enabling the accuracy in reading/writing the data to be significantly enhanced.

While preferred embodiments have been shown and described, various modifications and substitutions may be made without departing from the spirit and scope of the invention. Accordingly, it is to be understood that the present invention has been described by way of example, and not by limitation.

What is claimed is:

1. A circuit board comprising: an analog circuit section and a digital circuit section,
    wherein said analog circuit section includes at least one analog signal external conductor,
    wherein said digital circuit section includes at least one digital signal processing section for outputting at least one digital signal and at least one digital signal external conductor connected to said at least one signal processing section, and
    wherein at least one digital signal output control means, for controlling whether or not said at least one digital signal output from said at least one digital signal processing section is withheld from said at least one digital signal external conductor, is interposed between said at least one digital signal processing section and said at least one digital signal external conductor, such that said at least one digital signal output is withheld from said at least one digital signal external conductor when analog signal passes through said at least one analog signal external conductor.

2. The circuit board according to claim 1, wherein said at least one digital signal output control means prohibits the function of outputting said at least one digital signal in said at least one digital signal processing section to said at least one digital signal external conductor.

3. The circuit board according to claim 1 or 2, wherein said at least one digital signal output control means is constituted by a connection means for on/off-controlling an electrical connection between said at least one digital signal processing section and said at least one digital signal external conductor.

4. The circuit board according to claim 1, said at least one digital signal output control means has a function of converting said at least one digital signal supplied from said at least one digital signal processing section into a DC signal having a predetermined constant potential.

5. The circuit board according to one of claims 1–4, wherein said at least one digital signal processing section is mounted onto a semiconductor chip together with at least one analog signal processing section for processing and outputting an analog signal processed in said analog circuit section.

6. A circuit hoard comprising:
(a) at least one digital signal processing section for processing at least one digital signal;
(b) at least one switch means connected to said at least one digital signal processing section for on/off controlling the output of said at least one digital signal output therefrom;
(c) at least one digital signal external conductor connected to said at least one switch means;
(d) at least one analog signal processing section connected to said at least one digital processing section for processing at least one analog signal; and
(e) at least one analog signal external conductor connected to said at least one analog signal processing section for inputting/outputting said at least one analog signal,
wherein said switch means is operable to cause said at least one digital signal output to be withheld from said at least one digital signal external conductor when an analog signal passes through said at least one analog signal external conductor.

7. The circuit board according to claim 6, wherein said at least one digital signal processing section, said at least one switch means and said at least one digital signal external conductor are unified in the form of an integrated circuit.

8. An information storing apparatus comprising:
(a) an information recording medium driving means for driving an informational recording medium;
(b) a pick-up means disposed in said information recording medium driving means for reproducing an informational signal by scanning said information recording medium;
(c) an analog circuit section connected to said pick-up means;
(d) a digital circuit section connected to said analog circuit section,
(e) wherein said analog circuit and said digital circuit are disposed on a circuit board,
wherein said digital circuit section comprising:
(f) at least one digital signal processing section for processing at least one digital signal to output said at least one digital signal thus processed; and
(g) at least one digital signal output control means connected to said at least one digital signal processing section for convening said at least one digital signal output from said at least one digital signal processing section into a DC signal having a predetermined constant potential,
(h) at least one digital signal external conductor connected to said at least one digital signal output control means.

9. An information storing apparatus comprising:
(a) an information recording medium driving means for driving an information recording medium;
(b) a pick-up means disposed in said information recording medium driving means for reproducing an information signal by scanning said information recording medium;
(c) an analog circuit section connected to said pick-up means;
(d) a digital circuit section connected to said analog circuit section
(e) wherein said analog circuit section and said digital circuit section are mounted on a circuit board.
wherein said digital circuit section comprising:
(f) at least one digital signal processing section for processing and outputting at least one digital signal;
(g) at least one switch means connected to said at least one digital signal processing section for on/off-controlling the output of said at least one digital signal generated in said at least one digital signal processing section; and
(h) at least one digital signal external conductor connected to said at least one switch means for transmitting said at least one digital signal.

* * * * *